(12) United States Patent
Wu et al.

(10) Patent No.: US 9,137,931 B2
(45) Date of Patent: Sep. 15, 2015

(54) DATA CENTER MODULE

(71) Applicant: INDUSTRIAL TECHNOLOGY RESEARCH INSTITUTE, Hsinchu (TW)

(72) Inventors: Hsi-Sheng Wu, Hsinchu County (TW); Hsu-Cheng Chiang, Hsinchu (TW); Kuo-Shu Hung, Changhua County (TW); Kuel-Ker Sun, Hsinchu County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 310 days.

(21) Appl. No.: 13/789,285

(22) Filed: Mar. 7, 2013

(65) Prior Publication Data

US 2013/0182388 A1    Jul. 18, 2013

Related U.S. Application Data

(63) Continuation of application No. 12/981,124, filed on Dec. 29, 2010, now Pat. No. 8,441,789.

(30) Foreign Application Priority Data

Oct. 29, 2010   (TW) .............................. 099137335 A

(51) Int. Cl.
   *H05K 7/20* (2006.01)
(52) U.S. Cl.
   CPC ............ *H05K 7/208* (2013.01); *H05K 7/20754* (2013.01); *H05K 7/20827* (2013.01)

(58) Field of Classification Search
   USPC ....................... 361/676–678, 679.46–679.54, 361/688–723, 752, 760, 831
   See application file for complete search history.

(56) References Cited

U.S. PATENT DOCUMENTS

| 5,467,609 A | 11/1995 | Feeney |
| 5,718,117 A | 2/1998 | McDunn et al. |
| 6,557,624 B1 | 5/2003 | Stahl et al. |
| 6,574,104 B2 | 6/2003 | Patel et al. |

(Continued)

FOREIGN PATENT DOCUMENTS

| CN | 201039641 Y | 3/2008 |
| CN | 101509684 A | 8/2009 |

(Continued)

OTHER PUBLICATIONS

China Patent Office, Office Action, Patent Application Serial No. CN201110334726.5, Jan. 24, 2014, China.

(Continued)

*Primary Examiner* — Courtney Smith
(74) *Attorney, Agent, or Firm* — Rabin & Berdo, P.C.

(57) ABSTRACT

A module for data center is presented, which is used for heat sinking of a heat source. The module for data center includes a first chamber, a second chamber, and a heat pipe. The heat source is positioned in the first chamber. The second chamber is adjacent to the first chamber. In addition, the heat pipe has an evaporation end positioned inside the first chamber and a condensation end positioned inside the second chamber. The heat pipe absorbs the heat energy in the first chamber with the evaporation end, transfers the heat energy to the condensation end, and eliminates the heat energy with the condensation end.

22 Claims, 13 Drawing Sheets

(56) References Cited

U.S. PATENT DOCUMENTS

| | | | |
|---|---|---|---|
| 6,775,137 | B2 | 8/2004 | Chu et al. |
| 6,819,563 | B1 | 11/2004 | Chu et al. |
| 6,859,366 | B2 | 2/2005 | Fink |
| 7,315,448 | B1 | 1/2008 | Bash et al. |
| 7,345,877 | B2 * | 3/2008 | Asfia et al. .......... 361/700 |
| 7,430,118 | B1 | 9/2008 | Noteboom et al. |
| 7,500,911 | B2 | 3/2009 | Johnson et al. |
| 7,511,960 | B2 | 3/2009 | Hillis et al. |
| 7,626,820 | B1 | 12/2009 | Konshak et al. |
| 8,077,463 | B2 * | 12/2011 | Lee .......... 361/700 |
| 8,934,245 | B2 * | 1/2015 | Yoshikawa .......... 361/700 |
| 2003/0128525 | A1 | 7/2003 | Berry et al. |
| 2004/0221604 | A1 | 11/2004 | Ota et al. |
| 2007/0146996 | A1 | 6/2007 | Herring et al. |
| 2008/0205003 | A1 | 8/2008 | Belady |
| 2009/0080151 | A1 | 3/2009 | Kalms et al. |
| 2009/0161312 | A1 | 6/2009 | Spearing et al. |
| 2010/0319883 | A1 * | 12/2010 | Facusse .......... 165/104.26 |
| 2011/0286175 | A1 | 11/2011 | Iyengar et al. |

FOREIGN PATENT DOCUMENTS

| | | |
|---|---|---|
| CN | 101713578 A | 5/2010 |
| TW | M251439 U | 11/2004 |
| TW | I237174 B | 8/2005 |
| TW | M295763 U | 8/2006 |
| TW | M311709 | 5/2007 |
| TW | M326135 | 1/2008 |
| TW | M346849 U | 12/2008 |
| TW | M383280 U | 6/2010 |

OTHER PUBLICATIONS

Taiwan Patent office,Office Action, Feb. 25, 2013.
Chen et al., "High Efficiency Plate Type Heat Pip", NARL Quartely, National Applied Research Laboratories, Taiwan, R.O.C., pp. 40-47, Jul. 2007.
Ke et al., "Research and Development on Innovative Makeup Air Unit", Symposium of the 1st (2002)Taiwan Society of Heating, Refrigerating and Air-Conditioning EngineersNational Taipei University of Technology, Taiwan, R.O.C. , pp. 270-281,Jul. 2002.
Zhang et al., "Thermal Performance Analysis of Heat Pipe Used in Electronics Cooling", Fluid Machinery, Chinese Society of Mechanical Engineers, Taiwan, R.O.C. , vol. 36, No. 8, pp. 79-82, 2008.
Yang, "The New of Energy Saving in HVAC-Heat Pipe", Zhong Guo Leng Dong Kong Diao Za Zhi, Chung Jr Publishing Co., Ltd., Taiwan, R.O.C., No. 29, pp. 128-136, Dec. 1996.
Yang, "Introduction to the Applications of Heat Pipe on HVAC", Zhong Guo Leng Dong Kong Diao Za Zhi, Chung Jr Publishing Co., Ltd., Taiwan, R.O.C., Issue 35, pp. 94-105, Dec. 1997.

* cited by examiner

DATA CENTER MODULE

CROSS-REFERENCE TO RELATED APPLICATIONS

This application is a continuation application of U.S. patent application Ser. No. 12/981,124, filed Dec. 29, 2010, entitled "DATA CENTER MODULE", by Hsi-Sheng WU, which is hereby incorporated herein in its entirety by reference.

BACKGROUND

1. Field

The present disclosure relates to a data center module, and more particularly to a data center module capable of preventing an electronic device from pollution by air.

2. Related Art

In a conventional cooling method for a data center, an air conditioning system of a common house or an office building is generally used, or a design of cold and heat channels is introduced. For example, in the air conditioning system, a coolant is compressed by a compressor into a high-temperature and high-pressure coolant gas, which is fed into a condenser. Then, a cooling fluid is fed into the condenser by a cooling water tower in combination with a pump for heat exchange, such that the high-temperature and high-pressure coolant gas is condensed into a high-pressure coolant liquid, which is charged into a liquid receiving vessel. Next, the high-pressure coolant liquid is fed to an expansion valve via a pipeline for expansion, and then fed into an evaporator to form a low-pressure coolant gas for heat absorption, thereby lowering the indoor temperature. However, the data center is generally an operation site of high-intensity heat load, and the power of a single server rack may be between 20 kw and 40 kw, or even more higher. That is, several or tens of high heat-generation racks is filled in the whole data center, such that the air conditioning power consumption required by a data center is maintained high. As a result, the heat sinking manner using an air conditioning system consumes too much energy. The power usage effectiveness (PUE) of a common data center is generally between 2 and 2.5 at present. That is, the data center generally needs to cost additionally 1 to 1.5 times of the power for the cooling system, and this is undoubtedly a waste of cost. In addition, with rising environmental protection awareness in recent years, the conception of energy saving and carbon reduction is always the goal sought in each industry to avoid ongoing exacerbation of global warming tendency.

Therefore, in order to lower the energy consumption in the conventional cooling method of the data center, a cooling manner of introducing an external gas is conventionally developed. The principle is to arrange a data center at a region of high latitude, such that the cold air of the external environment enters the data center for heat exchange. However, impurities such as sulfide or nitride exist in the external air, so that the simple introduction of the external air causes pollution to the electronic elements in the data center by the external air. As a result, this cooling manner easily causes the failure of the electronic elements in the data center due to pollution.

SUMMARY

In view of the problems above, the present disclosure is a data center module, so as to solve the problem that the electronic elements in the data center are susceptible to pollution of external air in the prior art.

The data center module according to the present disclosure is used for heat sinking of a plurality of servers in at least one server rack. The data center module comprises a first chamber, a second chamber, and a heat pipe. The server rack is positioned in the first chamber. The second chamber is adjacent to the first chamber. In addition, the heat pipe has an evaporation end positioned inside the first chamber and a condensation end positioned inside the second chamber. The heat pipe absorbs the heat energy emitted from the server rack in the first chamber with the evaporation end, transfers the heat energy to the condensation end, and eliminates the heat energy with the condensation end.

According to the data center module of the present disclosure, the heat energy is expelled from the first chamber into the second chamber through the heat pipe. In addition, the first chamber is positioned inside the server rack. Therefore, the heat sink effect can be achieved without direct contact between the external air and the server rack. Thus, for such a data center module, the electronic members in the server rack can be prevented from pollution caused by external air.

These and other aspects of the present disclosure will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the disclosure and, together with the written description, serve to explain the principles of the disclosure. Wherever possible, the same reference numbers are used throughout the drawings to refer to the same or like elements of an embodiment, and wherein.

DETAILED DESCRIPTION

Figure 1:
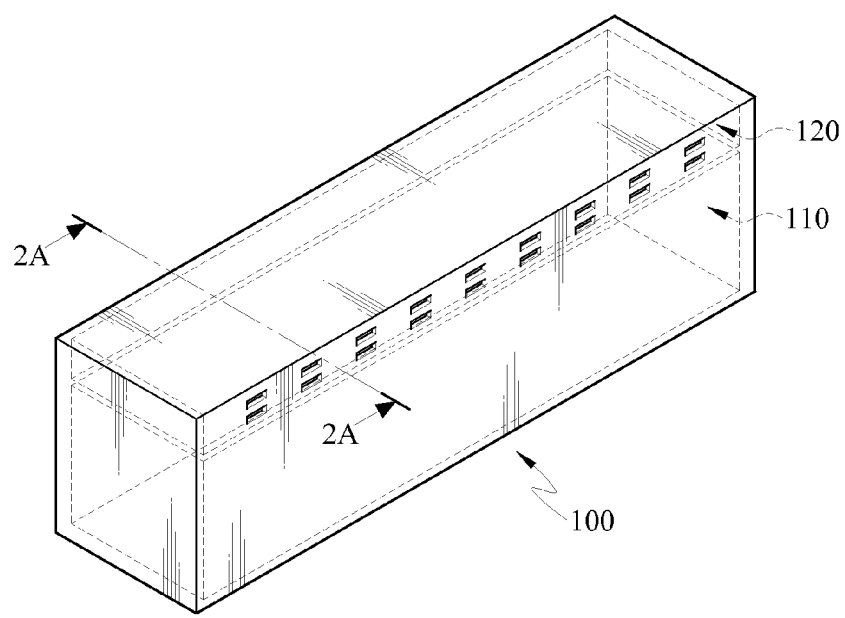
FIG. 1 is a schematic view of a data center module according to an embodiment of the present disclosure.
Figure 2A:
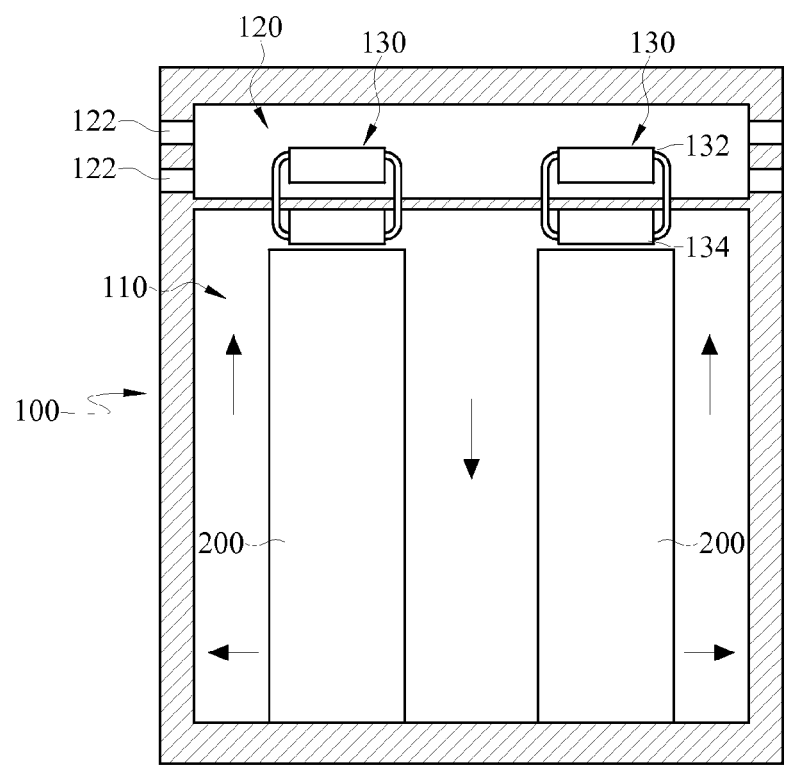
FIG. 2A is a flat side view of a data center module according to an embodiment of the present disclosure along a section line 2A as shown in FIG. 1.

FIG. 1 is a schematic view of a data center module according to an embodiment of the present disclosure, and FIG. 2A is a flat side view of a data center module according to an embodiment of the present disclosure along a section line 2A as shown in FIG. 1.

A data center module 100 according to the embodiment of the present disclosure is used for heat sinking of server in a server rack 200.

Figure 2B:
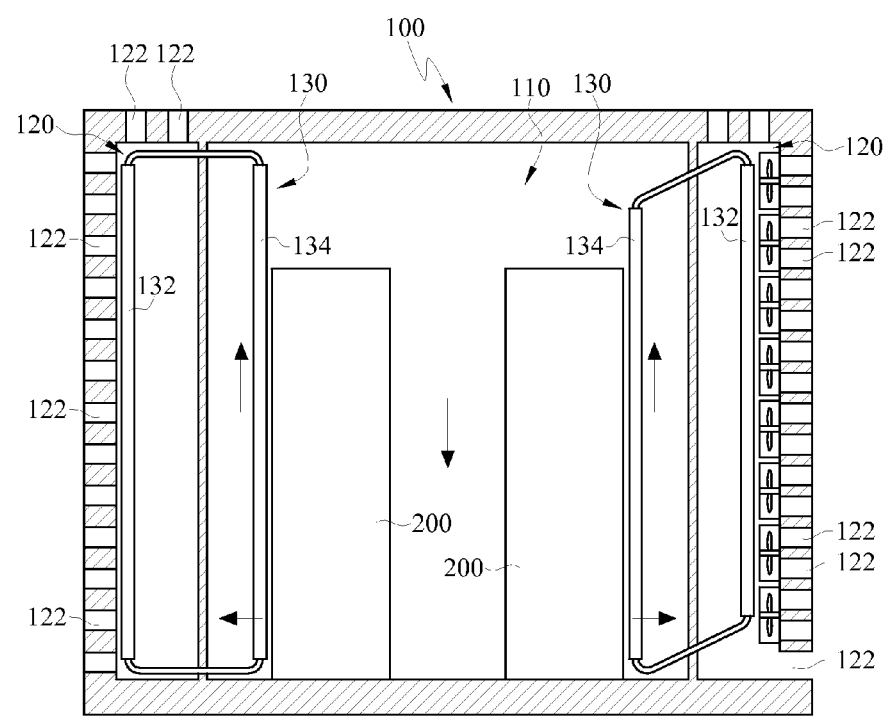
FIG. 2B is a flat side view of a data center module according to another embodiment of the present disclosure.

The data center module 100 is generally in the configuration of a cabinet, so as to be conveniently delivered to all places. The data center module 100 can be divided into a first chamber 110 and at least one second chamber 120. The first chamber 110 is adjacent to the second chamber 120. In this embodiment, one second chamber 120 exists, and is positioned above the first chamber 110; however, the number of the second chambers 120 and the positions of the first chamber 110 and second chambers 120 are not intended to limit the present disclosure. For example, in other embodiments of the present disclosure, two second chambers 120 may exist, and are positioned at left and right sides of the first chamber 110, as shown in FIG. 2B.

Figure 2C:
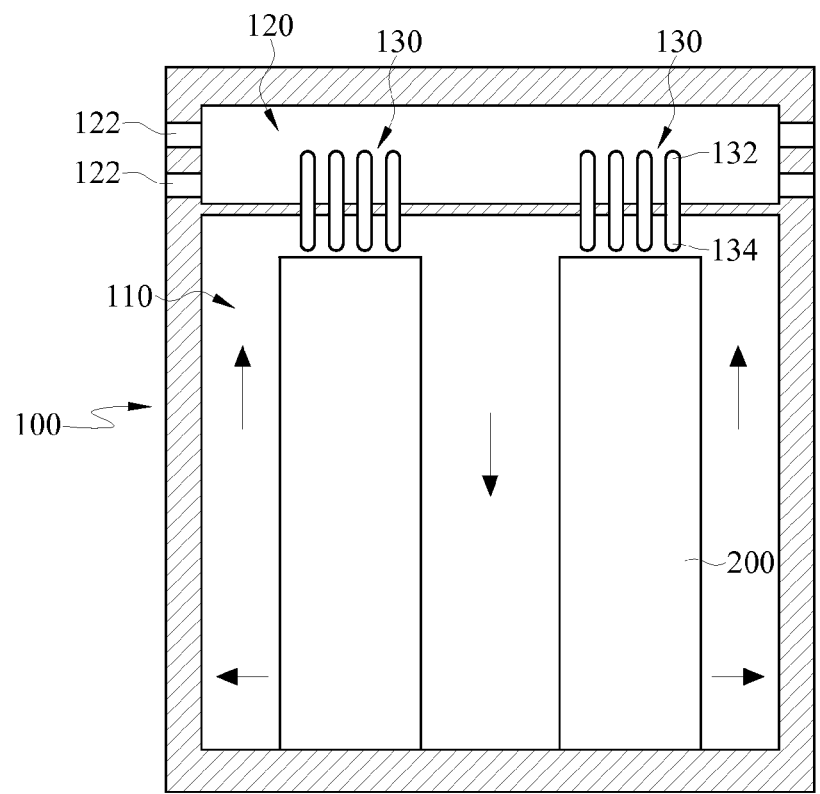
FIG. 2C is a flat side view of a data center module according to another embodiment of the present disclosure.

The air in the first chamber 110 may be not circulated with air from the external environment. The server rack 200 is positioned in the first chamber 110. A heat pipe 130 is disposed between the first chamber 110 and the second chamber 120. The heat pipe 130 may be, but is not limited to, a loop heat pipe (LHP). For instance, the heat pipe 130 may be a common single heat pipe as shown in FIG. 2C, which has a shape of an elongated bar.

The heat pipe 130 has an evaporation end 134 for absorbing heat energy and a condensation end 132 for expelling heat energy. The evaporation end 134 of the heat pipe 130 is positioned inside the first chamber 110, and the condensation end 132 is positioned inside the second chamber 120. In other words, the evaporation end 134 of the heat pipe 130 absorbs the heat energy emitted from the server rack 200 in the first chamber 110, and the condensation end 132 expels the heat energy to the second chamber 120.

In addition, the second chamber 120 may further have at least one air vent 122 in communication with the external environment. That is, the air in the second chamber 120 can be circulated and exchanged with the air in the external environment. Therefore, the heat energy is expelled to the second chamber 120 through the condensation end 132, and then the hot air in the second chamber 120 exchanges heat with the cold air in the external environment, so as to eliminate the heat energy. Furthermore, the evaporation end 134 absorbs the heat energy, such that the hot air around is cooled into cold air. As shown in FIG. 2A, the server rack 200 expels the heat energy generated by the server from the outside of the server rack 200 with an inner fan, such that the hot air ascends in the space (that is, heat channel) at the outer sides of two server racks 200. The cold air descends along the path (that is, cold channel) between two server racks 200, and thus a gas loop is generated to form convection. Therefore, the heat sink effect in the first chamber 110 is relatively improved. It should be noted that in a practical circumstance, the temperature in the heat channel can reach 50 degrees Celsius to 60 degrees Celsius, so a person has to walk in the cold channel of the gas loop (that is, the path between server racks 200 in this embodiment).

Figure 2D:
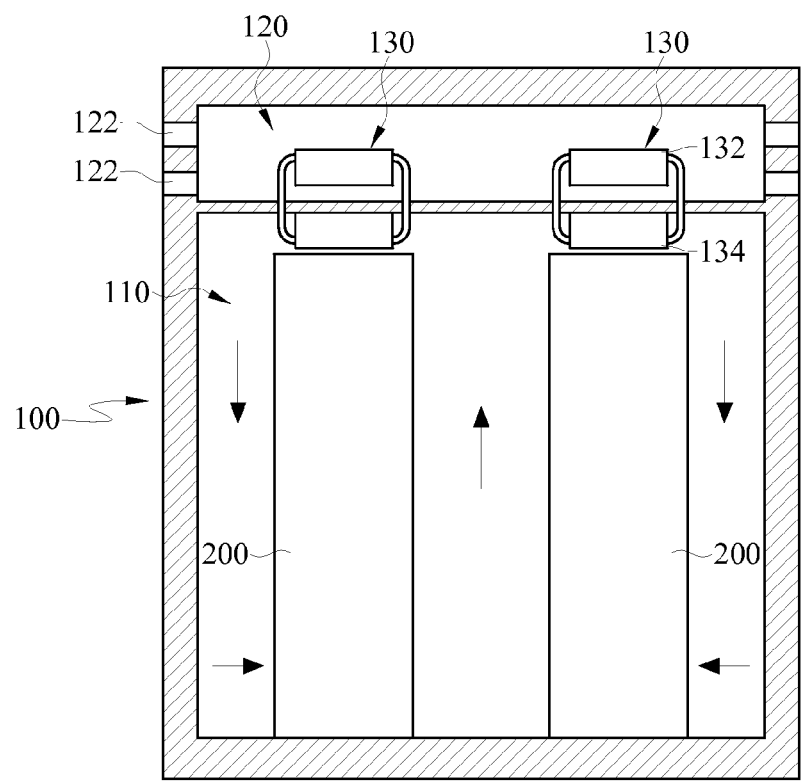
FIG. 2D is a flat side view of a data center module according to another embodiment of the present disclosure.

In case that the inner fan of the server rack 200 expels the heat energy generated by the server via the path between server racks 200, the hot air ascends along the path (that is, the heat channel) between the two server racks 200. The cold air descends along the space (that is, cold channel) at outer sides of the server racks 200, so a gas loop is generated to form convection, as shown in FIG. 2D.

Referring to FIG. 2B, in an embodiment as shown in FIG. 2B, a plurality of air vents 122 may be opened at a top surface and sidewall surfaces of the second chamber 120 on the left. The external air enters the second chamber 120 through the plurality of air vents 122 at the sidewall surfaces for heat exchange, and then is vented from the air vents 122 on the top surface. In addition, another vent manner may adopt a form of the second chamber 120 on the right, that is, a plurality of air vents 122 is only opened on the sidewall surface of the second chamber 120. The external air enters the second chamber 120 through the lower air vent 122 for heat exchange, and is then forced out by fan devices 170. The air may also be forced in the second chamber 120 by the fan devices 170 for heat exchange. It should be noted that many types that the external air enters the second chamber 120 for heat exchange exist, and only several examples are mentioned in the present disclosure, which are not intended to limit the present disclosure.

It should be noted that the data center module 100 according to this embodiment may be disposed in a region at a high altitude or latitude, that is, the temperature of the cold air in the external environment is low. In this way, heat exchange of the cold air with the condensation end 132 can be achieved by the natural convection between the cold air in the external environment and the air in the second chamber 120, so as to eliminate the heat energy. Therefore, the closed first chamber 110 can achieve the temperature drop effect while the data center module 100 according to this embodiment does not need to consume additional energy. Accordingly, such a data center module 100 can not only prevent the electronic elements in the data center module 100 from pollution caused by external air, but also meet the spirit of energy saving and carbon reduction.

In the above embodiment, the data center module 100 disposed in a region at a high altitude or latitude is described as an example, but not intended to limit the present disclosure. For example, the data center module 100 may also be disposed near a river, so as to achieve the effect of removing the heat energy of the condensation end 132 by using the natural water flow of the river. Hereinafter, a method for removing heat energy through water cooling is described.

Figure 3:
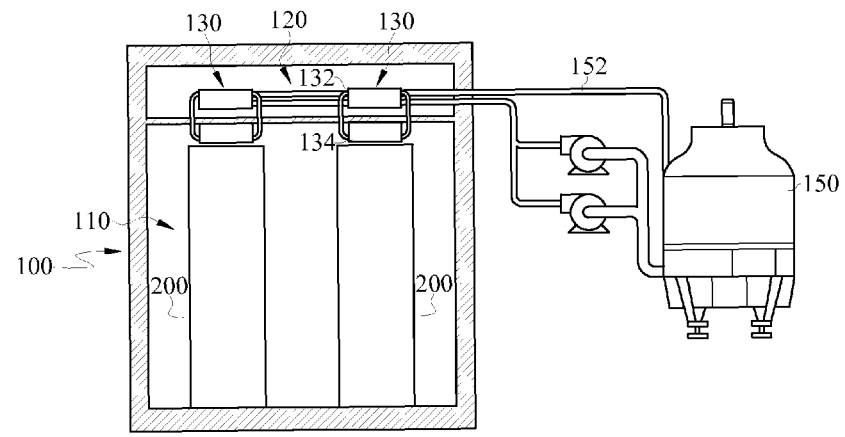
FIG. 3 is a flat side view of a data center module according to another embodiment of the present disclosure.

Referring to FIGS. 1 and 3, FIG. 3 is a flat side view of a data center module according to another embodiment of the present disclosure. As this embodiment is similar to the embodiment as shown in FIG. 2A, description is made according to the differences therebetween.

In this embodiment, a data center module 100 can be divided into a first chamber 110 and a second chamber 120 positioned above the first chamber 110. The first chamber 110 is a closed space, that is, the air in the first chamber 110 is not circulated with the air in the external environment. A server rack 200 is positioned in the first chamber 110. A heat pipe 130 has an evaporation end 134 positioned inside the first chamber 110 and a condensation end 132 positioned inside the second chamber 120. In addition, the data center module 100 may further comprise a cooling pipeline 152, which is combined with the condensation end 132 and used for removing the heat energy of the condensation end 132. Furthermore, the cooling pipeline 152 is externally connected to a cooling water tower 150, which can circulate a cooling fluid (for example, cold water) in the cooling pipeline 152 with the aid of a motor or a pumping device. In other words, the data center module 100 according to this embodiment can remove the heat energy of the condensation end 132 through the circulation of the cooling fluid, so the first chamber 110 achieves a good temperature drop effect.

It should be noted that in this embodiment, the cooling pipeline 152 in combination with the cooling water tower 150 is described as an example, but not intended to limit the present disclosure. For example, the cooling water tower 150 may be replaced by a common river, so as to provide the kinetic energy for flowing of water by using the natural gravity or a pump, thereby circulating the cooling fluid in the cooling pipeline 152.

Figure 4:
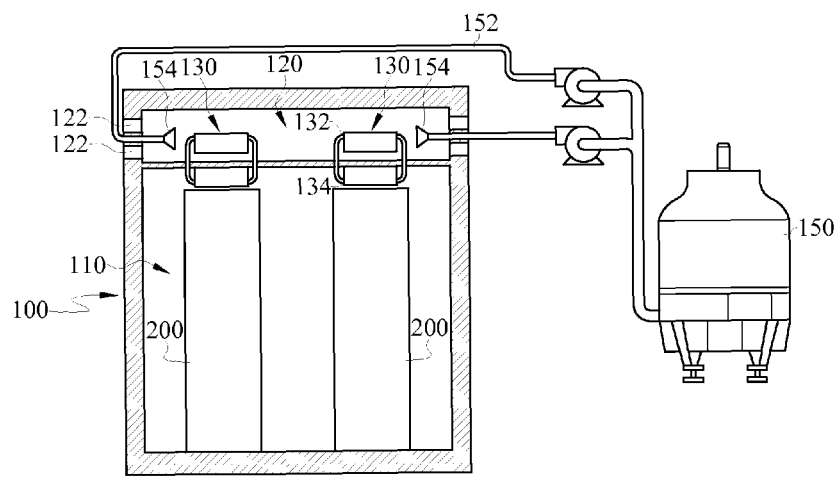
FIG. 4 is a flat side view of a data center module according to another embodiment of the present disclosure.

Referring to FIGS. 1 and 4, FIG. 4 is a flat side view of a data center module according to another embodiment of the present disclosure. As this embodiment is similar to the embodiment as shown in FIG. 2A, description is made according to the differences therebetween.

In this embodiment, a data center module 100 can be divided into a first chamber 110 and a second chamber 120 positioned above the first chamber 110. The first chamber 110 is a closed space, that is, the air in the first chamber 110 is not circulated with the air in the external environment. A server rack 200 is positioned in the first chamber 110. A heat pipe 130 has an evaporation end 134 positioned inside the first chamber 110 and a condensation end 132 positioned inside the second chamber 120. In addition, the data center module 100 may further comprise a cooling pipeline 152, which is externally connected to a cooling water tower 150. The cooling pipeline 152 further has a nozzle 154 at an end, and the nozzle 154 is disposed in the second chamber 120. The nozzle 154 can spray a cooling fluid in the cooling pipeline 152 in the form of atomized droplets to the condensation end 132 of the heat pipe 130 or air vents 122. The atomized droplets are evaporated upon natural convection of air, thus absorbing a large amount of heat. Therefore, through the arrangement of the nozzle 154, the efficiency for removing the heat energy of the condensation end 132 is improved, so the systematic effect of the whole data center module 100 is improved.

Figure 5:
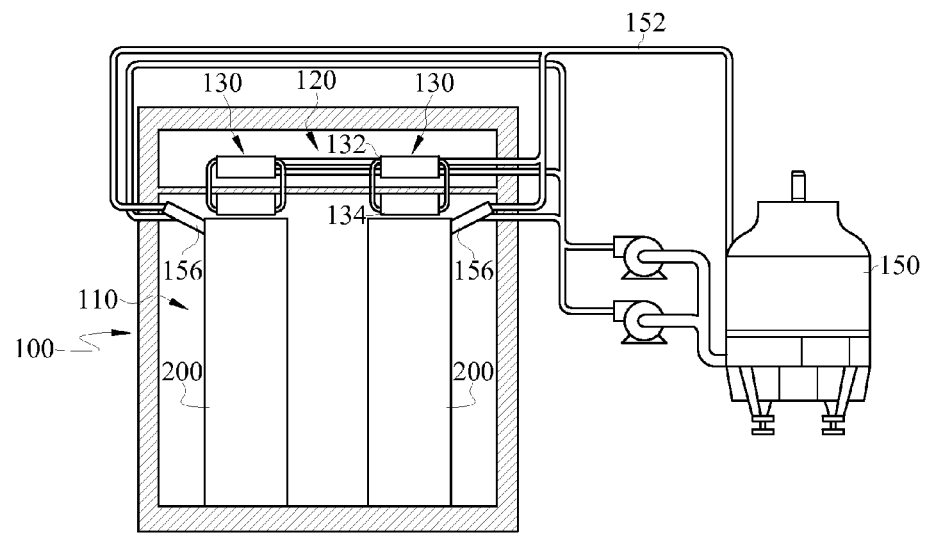
FIG. 5 is a flat side view of a data center module according to another embodiment of the present disclosure.

Referring to FIGS. 1 and 5, FIG. 5 is a flat side view of a data center module 100 according to another embodiment of the present disclosure. As this embodiment is similar to the embodiment as shown in FIG. 3A, description is made according to the differences therebetween.

In this embodiment, the data center module 100 can be divided into a first chamber 110 and a second chamber 120 positioned above the first chamber 110. The first chamber 110 is a closed space, that is, the air in the first chamber 110 is not circulated with the air in the external environment. A server rack 200 is positioned in the first chamber 110. A heat pipe 130 has an evaporation end 134 positioned inside the first chamber 110 and a condensation end 132 positioned inside the second chamber 120. The data center module 100 may further comprise a cooling pipeline 152 externally connected to a cooling water tower 150, combined with the condensation end 132, and used for removing the heat energy of the condensation end 132. In addition, the data center module 100 further comprises a heat exchanger 156 disposed in the first chamber 110. The heat exchanger 156 can have a flow channel therein, and is combined with the cooling pipeline 152, so a cooling fluid can flow into the heat exchanger 156. The temperature in the heat exchanger 156 can be lowered to become a cold source according to the principle above. The heat exchanger 156 may exchange heat with the hot air in the first chamber 110, so as to achieve the effect of lowering the temperature in the first chamber 110.

In this embodiment, the heat exchanger 156 is additionally disposed to provide additional heat sinking means. As a result, the overall heat sink effect of the data center module 10 is further improved.

Figure 6:
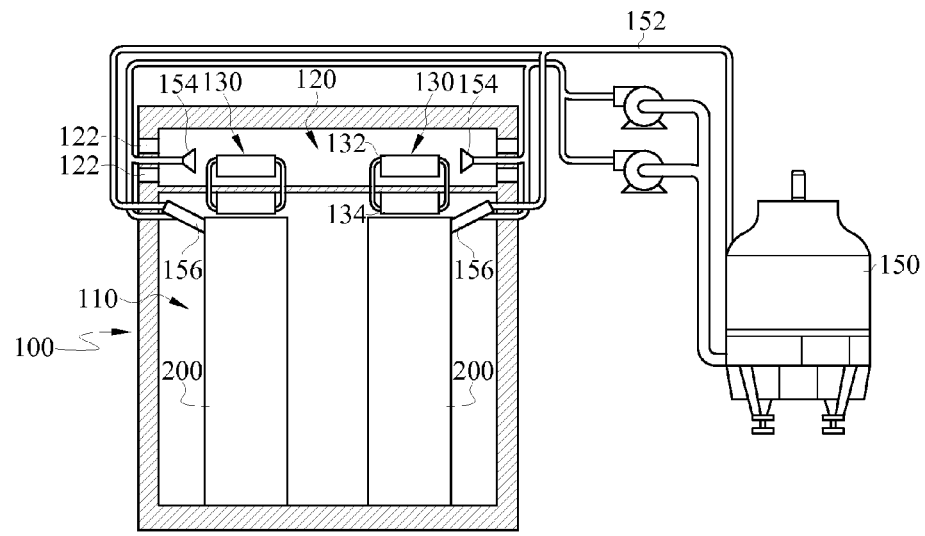
FIG. 6 is a flat side view of a data center module according to another embodiment of the present disclosure.

Referring to FIGS. 1 and 6, FIG. 6 is a flat side view of a data center module according to another embodiment of the present disclosure. As this embodiment is similar to the embodiment as shown in FIG. 2A, description is made according to differences therebetween. As this embodiment is a combination of the embodiment as shown in FIG. 4A with the relevant embodiment of the heat exchanger 156 as shown in FIG. 5, description is made according to differences therebetween.

In this embodiment, a data center module 100 can be divided into a first chamber 110 and a second chamber 120 positioned above the first chamber 110. The first chamber 110 is a closed space, that is, the air in the first chamber 110 is not circulated with the air in the external environment. A server rack 200 is positioned in the first chamber 110. A heat pipe 130 has an evaporation end 134 positioned inside the first chamber 110 and a condensation end 132 positioned inside the second chamber 120. In addition, the data center module 100 may further comprise a cooling pipeline 152, which is externally connected to a cooling water tower 150. The cooling pipeline 152 further has a nozzle 154 at an end, and the nozzle 154 is disposed in the second chamber 120. The nozzle 154 can spray a cooling medium in the cooling pipeline 152 in the form of atomized droplets to the condensation end 132 of the heat pipe 130 or air vents 122. The atomized droplets are evaporated upon natural convection of air, and thus can absorb large quantities of heat, thereby removing the heat energy of the condensation end 132. In addition, the data center module 100 further comprises a heat exchanger 156 disposed in the first chamber 110. The heat exchanger 156 can have a flow channel therein, and is combined with the cooling pipeline 152, so a cooling fluid can flow into the heat exchanger 156. The temperature in the heat exchanger 156 can be lowered to become a cold source according to the principle above. The heat exchanger 156 may exchange heat with the hot air in the first chamber 110, so as to achieve the effect of lowering the temperature in the first chamber 110. Therefore, through the arrangement of the nozzle 154 and the heat exchanger 156, the systematic effect of the whole data center module 100 is improved.

Figure 7:
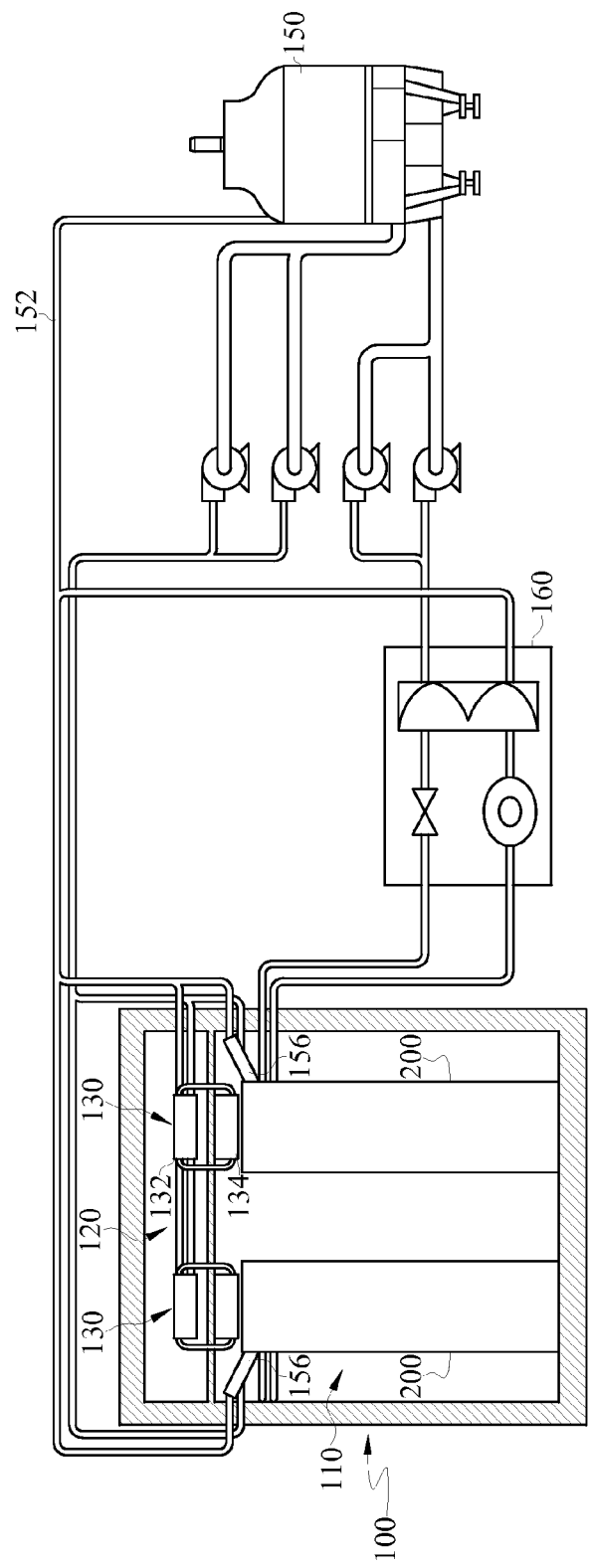
FIG. 7 is a flat side view of a data center module according to another embodiment of the present disclosure.

Referring to FIGS. 1 and 7, FIG. 7 is a flat side view of a data center module according to another embodiment of the present disclosure. As this embodiment is similar to the embodiment as shown in FIG. 5, description is made according to differences therebetween.

In this embodiment, the data center module 100 can be divided into a first chamber 110 and a second chamber 120 positioned above the first chamber 110. The first chamber 110 is a closed space, that is, the air in the first chamber 110 is not circulated with the air in the external environment. A server rack 200 is positioned in the first chamber 110. A heat pipe 130 has an evaporation end 134 positioned inside the first chamber 110 and a condensation end 132 positioned inside the second chamber 120. The data center module 100 may further comprise a cooling pipeline 152, which is externally connected to a cooling water tower 150, combined with the condensation end 132, and used for removing the heat energy of the condensation end 132. In addition, the data center module 100 further comprises a heat exchanger 156 disposed in the first chamber 110. The heat exchanger 156 can have a flow channel therein, and is combined with the cooling pipeline 152, so a cooling fluid can flow into the heat exchanger 156. The temperature in the heat exchanger 156 can be lowered to become a cold source by the principle above. Furthermore, the data center module 100 according to this embodiment may further comprise a freezer 160, connected to the heat exchanger 156 and the cooling water tower 150 respectively via the cooling pipeline 152. The freezer 160 may comprise a compressor, a condenser, an expansion valve, and an evaporator. The freezer 160 may utilize the liquid-vapor phase transition of a coolant to lower the temperature of the cooling fluid in the cooling pipeline 152, such that the cooling fluid is cooled to become ice-cold water and flows into the heat exchanger 156. Thus, the heat exchanger 156 can absorb more heat energy in the first chamber 110.

Figure 8:
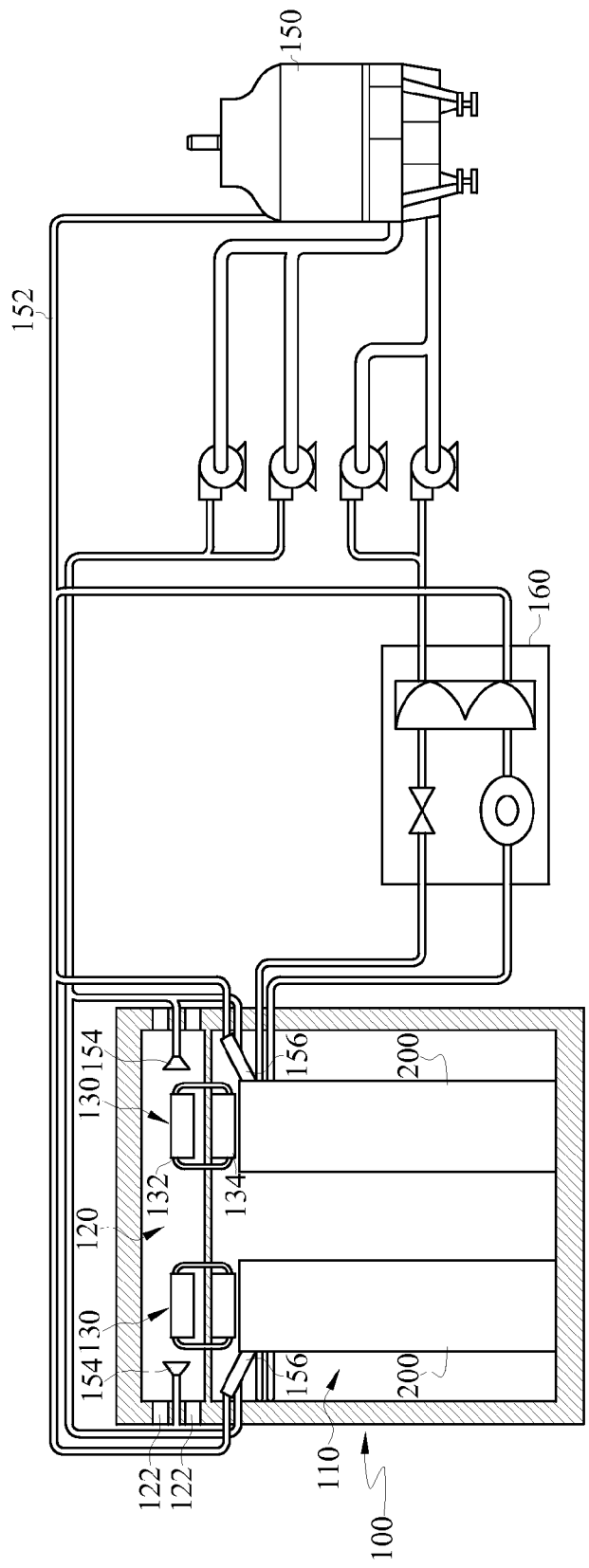
FIG. 8 is a flat side view of a data center module according to another embodiment of the present disclosure.

Referring to FIGS. 1 and 8, FIG. 8 is a flat side view of a data center module 100 according to another embodiment of the present disclosure. As this embodiment is similar to the embodiment as shown in FIG. 6, description is made according to differences therebetween.

In this embodiment, the data center module 100 can be divided into a first chamber 110 and a second chamber 120 positioned above the first chamber 110. The first chamber 110 is a closed space, that is, the air in the first chamber 110 is not circulated with the air in the external environment. A server rack 200 is positioned in the first chamber 110. A heat pipe 130 has an evaporation end 134 positioned inside the first chamber 110 and a condensation end 132 positioned inside the second chamber 120. In addition, the data center module 100 may further comprise a cooling pipeline 152 externally connected to a cooling water tower 150. The cooling pipeline 152 further has a nozzle 154 at an end, and the nozzle 154 is disposed in the second chamber 120. The nozzle 154 can spray a cooling fluid in the cooling pipeline 152 in the form of atomized droplets to the condensation end 132 of the heat pipe 130 or an air vent 122. The atomized droplets are evaporated upon natural convection of air, thus absorbing a large amount of heat, thereby removing the heat energy of the condensation end 132.

In addition, the data center module 100 further comprises a heat exchanger 156 disposed in the first chamber 110. The heat exchanger 156 can have a flow channel therein, and is combined with the cooling pipeline 152, so a cooling fluid can flow into the heat exchanger 156. The temperature in the heat exchanger 156 can be lowered to become a cold source according to the principle above. Furthermore, the data center module 100 according to this embodiment may further comprise a freezer 160 connected to the heat exchanger 156 and the cooling water tower 150 respectively via the cooling pipeline 152. The freezer 160 may comprise a compressor, a condenser, an expansion valve, and an evaporator. The freezer 160 may utilize the phase transition of a coolant to lower the temperature of the cooling fluid in the cooling pipeline 152, such that the cooling fluid is cooled and becomes ice-cold water and flows into the heat exchanger 156. Thus, the heat exchanger 156 can absorb more heat energy from the first chamber 110.

Figure 9A:
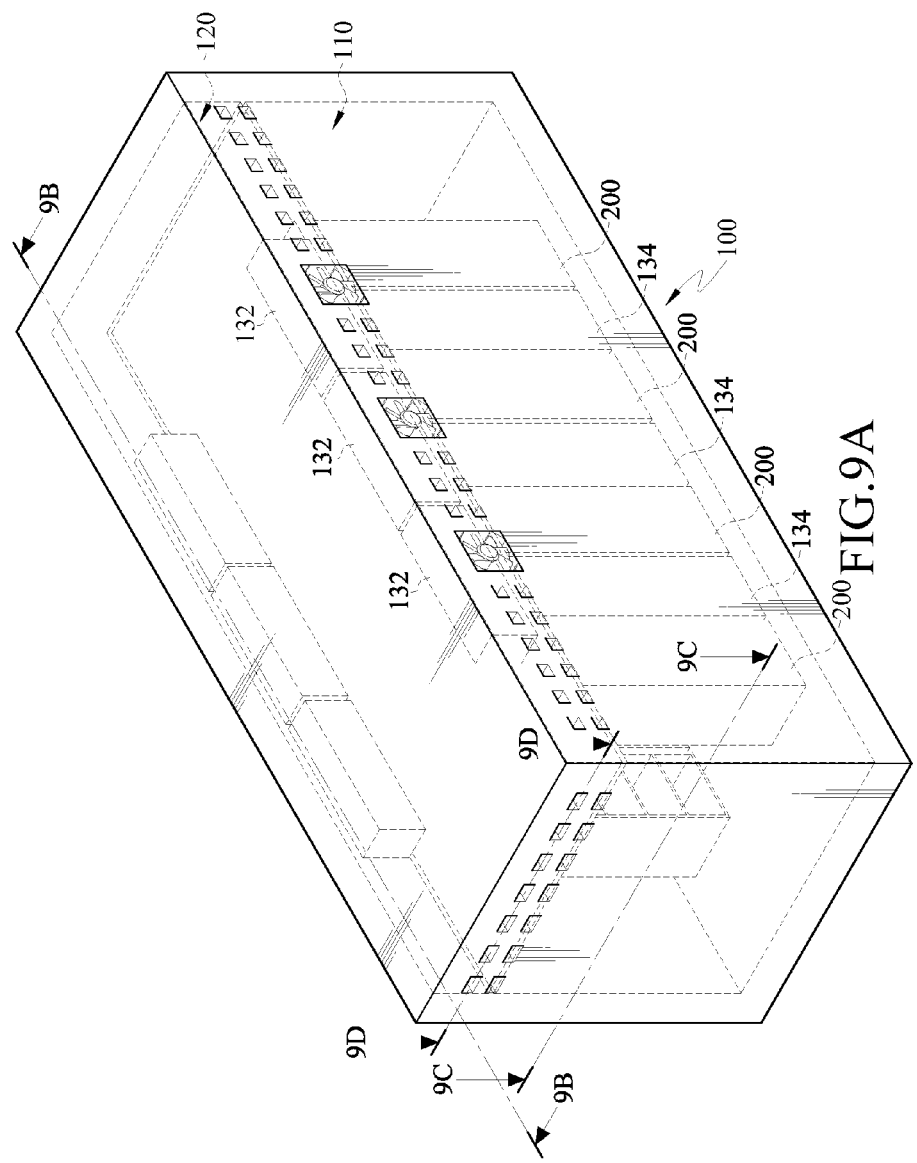
FIG. 9A is a 3D structural view of a data center module according to another embodiment of the present disclosure.
Figure 9B:
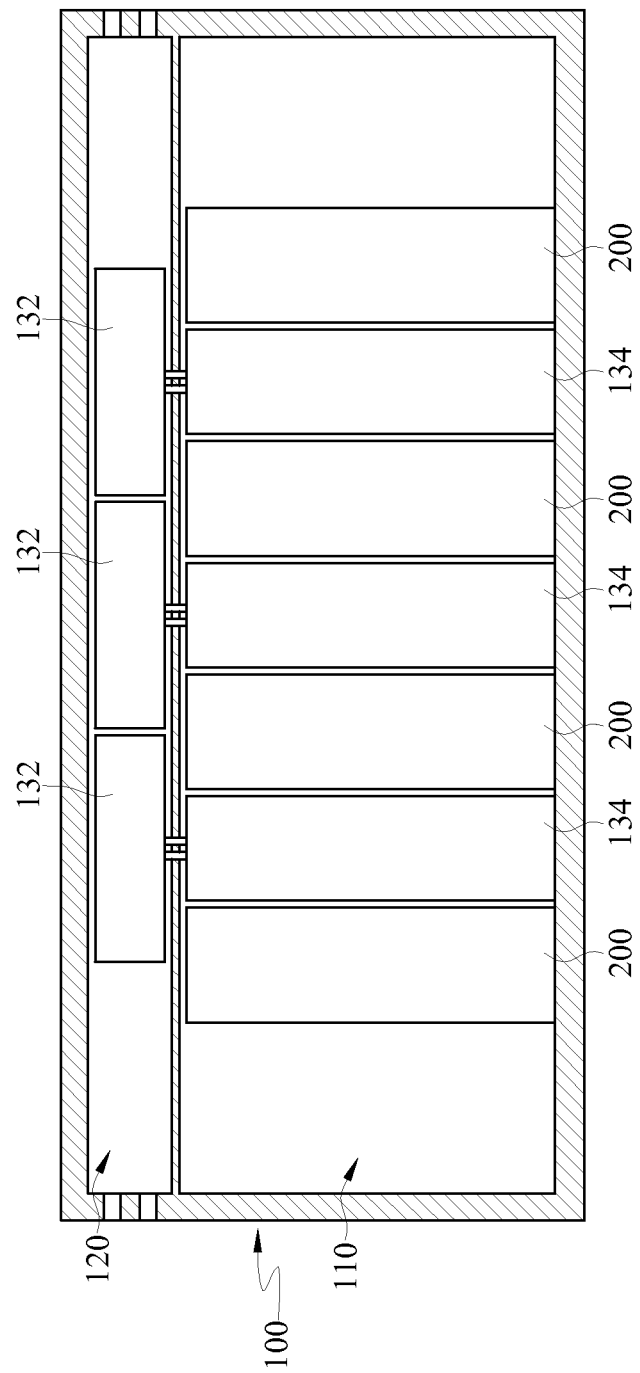
FIG. 9B is a flat side view of a data center module along a section line 9B as shown in FIG. 9A.
Figure 9C:
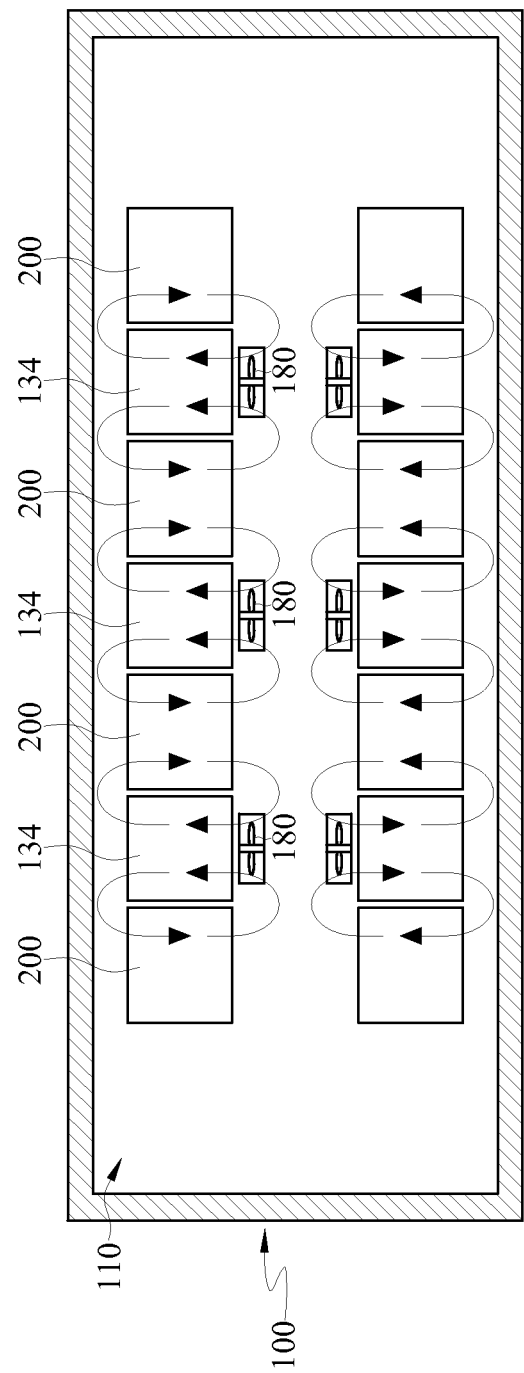
FIG. 9C is a flat side view of a data center module along a section line 9C as shown in FIG. 9A.
Figure 9D:
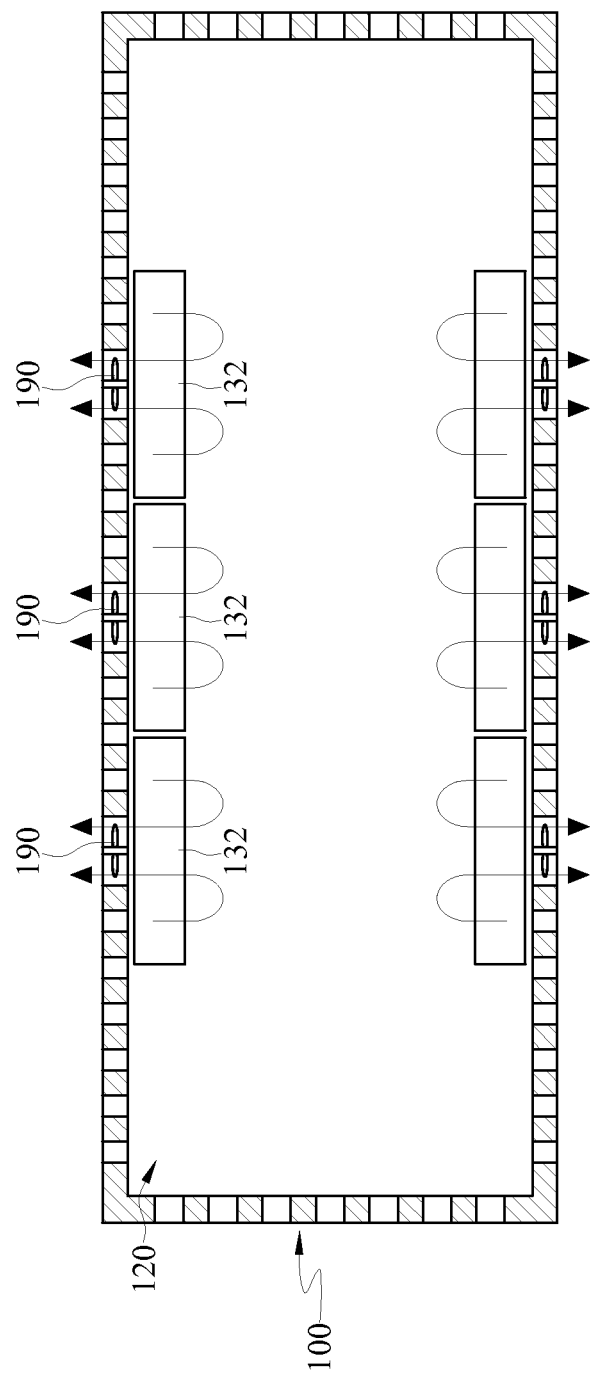
FIG. 9D is a flat side view of a data center module along a section line 9D as shown in FIG. 9A.

Referring to FIGS. 9A to 9D, FIG. 9A is a 3D structural view of a data center module according to another embodiment of the present disclosure; FIG. 9B is a flat side view of a data center module along a section line 9B as shown in FIG. 9A; FIG. 9C is a flat side view of a data center module along a section line 9C as shown in FIG. 9A; and FIG. 9D is a flat side view of a data center module according to another embodiment of the present disclosure along a section line 9D as shown in FIG. 9A. As this embodiment is similar to the embodiment as shown in FIG. 2A, description is made according to differences therebetween.

In this embodiment, an evaporation end 134 of a data center module 100 may extend from the upper part to the lower part in the first chamber 110, and the evaporation end 134 may be positioned between two server racks 200, as shown in FIGS. 9A and 9B.

The data center module 10 may be further disposed with a first fan 180 and a second fan 190 therein. The first fan 180 is disposed in the first chamber 110, with the air outlet of the first fan 180 facing the evaporation end 134. The first fan 180 runs and generates an air flow which is blown to the evaporation end 134, thereby generating forced convection in the first chamber 110 as shown in FIG. 9C, so as to improve the heat exchange efficiency in the first chamber 110. In addition, the second fan 190 is disposed in the second chamber 120, and adjacent to the condensation end 132. The second fan 190 runs and generates forced convection, such that the heat energy of the condensation end 132 can be removed by the external cold air more quickly, as shown in FIG. 9D.

It should be noted that in the data center module 100 according to the embodiment of the present disclosure, the first fan 180 and the second fan 190 are further disposed to achieve the effect of forced convection. However, upon forced convection by using a fan, there are many examples of the combination of the positions of the fans, the opening position of the air vents 122, the positions of the heat pipes 130, and the form of gas flow circulation. The drawings in this embodiment are described with reference to an example, which is not intended to limit the present disclosure. Any effect of forced gas flow circulation achieved through disposition of fans shall fall within the scope of the present disclosure.

In the data center module according to the embodiment of the present disclosure, the heat energy in the first chamber is expelled to the second chamber through the heat pipe. In addition, the first chamber in which the heat source is positioned is a closed space. Therefore, the heat sink effect can be achieved without direct contact between the external air and the heat source. Accordingly, such a data center module can prevent the heat source from pollution caused by external air. Moreover, the data center module according to this embodiment can be further disposed with a nozzle to spray the atomized droplets, a cooling water pipe, a heat exchanger, a freezer, and fans, so as to improve the cooling efficiency of the data center module.

What is claimed is:

1. A data center module, for dissipating heat in a data center, comprising:
    a cabinet body, having a first chamber and a second chamber separated from the first chamber by a wall which is located in the cabinet body, the first chamber defining a cold channel and a heat channel;
    at least one server rack, having a plurality of servers placed therein, the at least one server rack being disposed in the first chamber and having a first side and a second side opposite to each other, with the first side facing to the heat channel, and the second side facing to the cold channel; and
    a heat pipe, disposed on and penetrating the wall, the heat pipe having an evaporation end positioned inside the first chamber and a condensation end positioned inside the second chamber;
    wherein a fan in the at least one server rack flows the heat generated by the servers in form of an air flow from the first side of the at least one server rack through the heat channel and the evaporation end, with the heat pipe absorbing the heat of the air flow and transferring the absorbed heat to the condensation end, before the air flow flows through the cold channel and returns to the at least one server rack from the second side of the at least one server rack.

2. The data center module according to claim 1, wherein the second chamber further has at least an air vent in communication with external environment, and natural convection is generated between the air in the second chamber and the air in the external environment, so as to eliminate the heat energy of the condensation end.

3. A data center module, for dissipating heat in a data center, comprising:
   a cabinet body, having a first chamber and a second chamber separated from the first chamber by a wall which is located in the cabinet body, the first chamber defining a cold channel and a heat channel;
   at least one server rack, having a plurality of servers placed therein, the at least one server rack being disposed in the first chamber and having a first side and a second side opposite to each other, with the first side facing to the heat channel, and the second side facing to the cold channel;
   a heat pipe, disposed on and penetrating the wall, the heat pipe having an evaporation end positioned inside the first chamber and a condensation end positioned inside the second chamber, and
   a cooling pipeline having a nozzle at one end, wherein the nozzle is disposed in the second chamber, and sprays atomized liquid to the condensation end or an air vent.

4. The data center module according to claim 3, wherein the cooling pipeline is connected to a cooling water tower.

5. The data center module according to claim 3, wherein the cooling pipeline is connected to a pump, so a cooling fluid circularly flows in the cooling pipeline.

6. The data center module according to claim 3, further comprising a heat exchanger disposed in the first chamber and connected to the cooling pipeline.

7. The data center module according to claim 6, wherein the cooling pipeline is connected to a cooling water tower.

8. The data center module according to claim 6, wherein the cooling pipeline is connected to a pump, so a cooling fluid circularly flows in the cooling pipeline.

9. The data center module according to claim 6, further comprising a freezer connected to the heat exchanger via the cooling pipeline.

10. The data center module according to claim 9, wherein the cooling pipeline is connected to a cooling water tower.

11. The data center module according to claim 9, wherein the cooling pipeline is connected to a pump, so a cooling fluid circularly flows in the cooling pipeline.

12. A data center module, for dissipating heat in a data center, comprising:
   a cabinet body, having a first chamber and a second chamber separated from the first chamber by a wall which is located in the cabinet body, the first chamber defining a cold channel and a heat channel;
   at least one server rack, having a plurality of servers placed therein, the at least one server rack being disposed in the first chamber and having a first side and a second side opposite to each other, with the first side facing to the heat channel, and the second side facing to the cold channel;
   a heat pipe, disposed on and penetrating the wall, the heat pipe having an evaporation end positioned inside the first chamber and a condensation end positioned inside the second chamber, and
   a cooling pipeline combined with the condensation end of the heat pipe and used for eliminating the heat energy of the condensation end.

13. The data center module according to claim 12, wherein the cooling pipeline is connected to a cooling water tower.

14. The data center module according to claim 12, wherein the cooling pipeline is connected to a pump, so a cooling fluid circularly flows in the cooling pipeline.

15. The data center module according to claim 12, further comprising a heat exchanger disposed in the first chamber and connected to the cooling pipeline.

16. The data center module according to claim 15, wherein the cooling pipeline is connected to a cooling water tower.

17. The data center module according to claim 15, wherein the cooling pipeline is connected to a pump, so a cooling fluid circularly flows in the cooling pipeline.

18. The data center module according to claim 15, further comprising a freezer connected to the heat exchanger via the cooling pipeline.

19. The data center module according to claim 18, wherein the cooling pipeline is connected to a cooling water tower.

20. The data center module according to claim 18, wherein the cooling pipeline is connected to a pump, so a cooling fluid circularly flows in the cooling pipeline.

21. The data center module according to claim 1, further comprising a first fan disposed in the first chamber and generating forced convection in the first chamber.

22. The data center module according to claim 1, further comprising a second fan disposed in the second chamber and generating forced convection in the second chamber.

* * * * *